(12) United States Patent
Sato

(10) Patent No.: US 10,185,437 B2
(45) Date of Patent: Jan. 22, 2019

(54) TOUCH SCREEN PANEL, INTERFACE CIRCUIT, AND INFORMATION PROCESSING APPARATUS

(71) Applicant: CANON KABUSHIKI KAISHA, Tokyo (JP)

(72) Inventor: Yoshikazu Sato, Nagareyama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/727,065

(22) Filed: Oct. 6, 2017

(65) Prior Publication Data

US 2018/0107331 A1 Apr. 19, 2018

(30) Foreign Application Priority Data

Oct. 14, 2016 (JP) .................. 2016-203035

(51) Int. Cl.
*G06F 3/041* (2006.01)
*G06F 3/044* (2006.01)
*G06F 3/045* (2006.01)
*H05K 9/00* (2006.01)

(52) U.S. Cl.
CPC ............ *G06F 3/0416* (2013.01); *G06F 3/044* (2013.01); *G06F 3/045* (2013.01); *H05K 9/0067* (2013.01); *G06F 2203/04107* (2013.01)

(58) Field of Classification Search
CPC ........ G06F 3/0416; G06F 3/044; G06F 3/045; G06F 2203/04107; H05K 9/0067
See application file for complete search history.

(56) References Cited

U.S. PATENT DOCUMENTS

| 9,470,933 | B2 * | 10/2016 | Yanase | .................. G06F 3/0412 |
| 9,772,736 | B2 | 9/2017 | Kikuchi | |
| 2007/0046639 | A1 * | 3/2007 | Swedin | ............... G02F 1/13338 345/173 |
| 2009/0256820 | A1 * | 10/2009 | Yanase | .................. G06F 3/0412 345/174 |
| 2012/0013569 | A1 * | 1/2012 | Swedin | ............... G02F 1/13338 345/174 |

FOREIGN PATENT DOCUMENTS

JP 2015-133082 A 7/2015

* cited by examiner

*Primary Examiner* — Dmitriy Bolotin
(74) *Attorney, Agent, or Firm* — Venable LLP

(57) ABSTRACT

A touch screen panel comprising a first electrode substrate equipped with a first electrode and a second electrode formed on a first transparent conductive film of the first electrode substrate, a second electrode substrate equipped with a third electrode and a fourth electrode formed on a second transparent conductive film of the second electrode substrate, an interface circuit that receives electrical signals from the first to the fourth electrodes and process the signals, and connecting portions that connect to the interface circuit, the interface circuit includes a member configured to make an impedance of a wiring path formed on the side where the connecting portion is provided and connected to one of the first to the fourth electrodes higher than an impedance of wiring paths connected to remaining electrode.

11 Claims, 8 Drawing Sheets

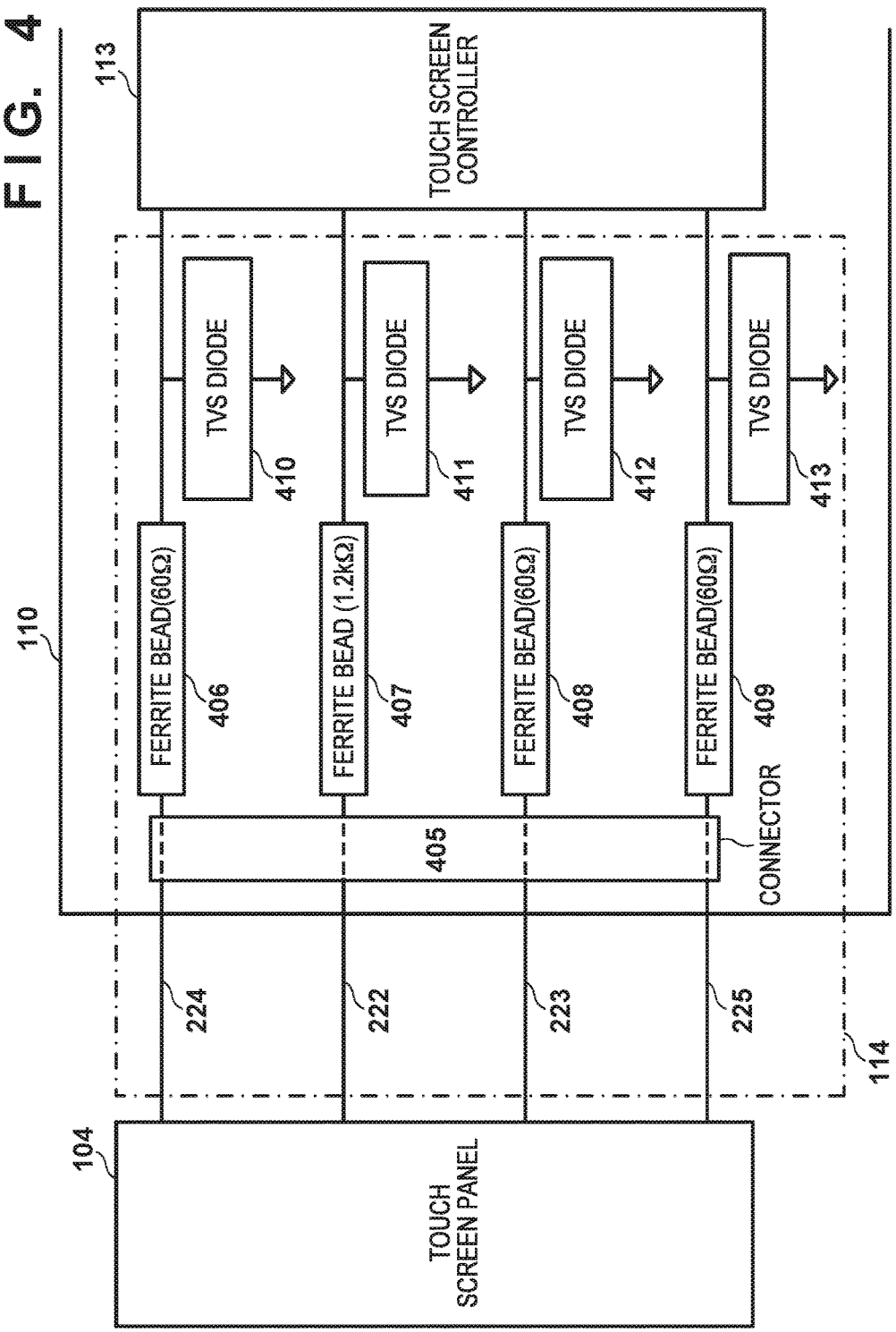

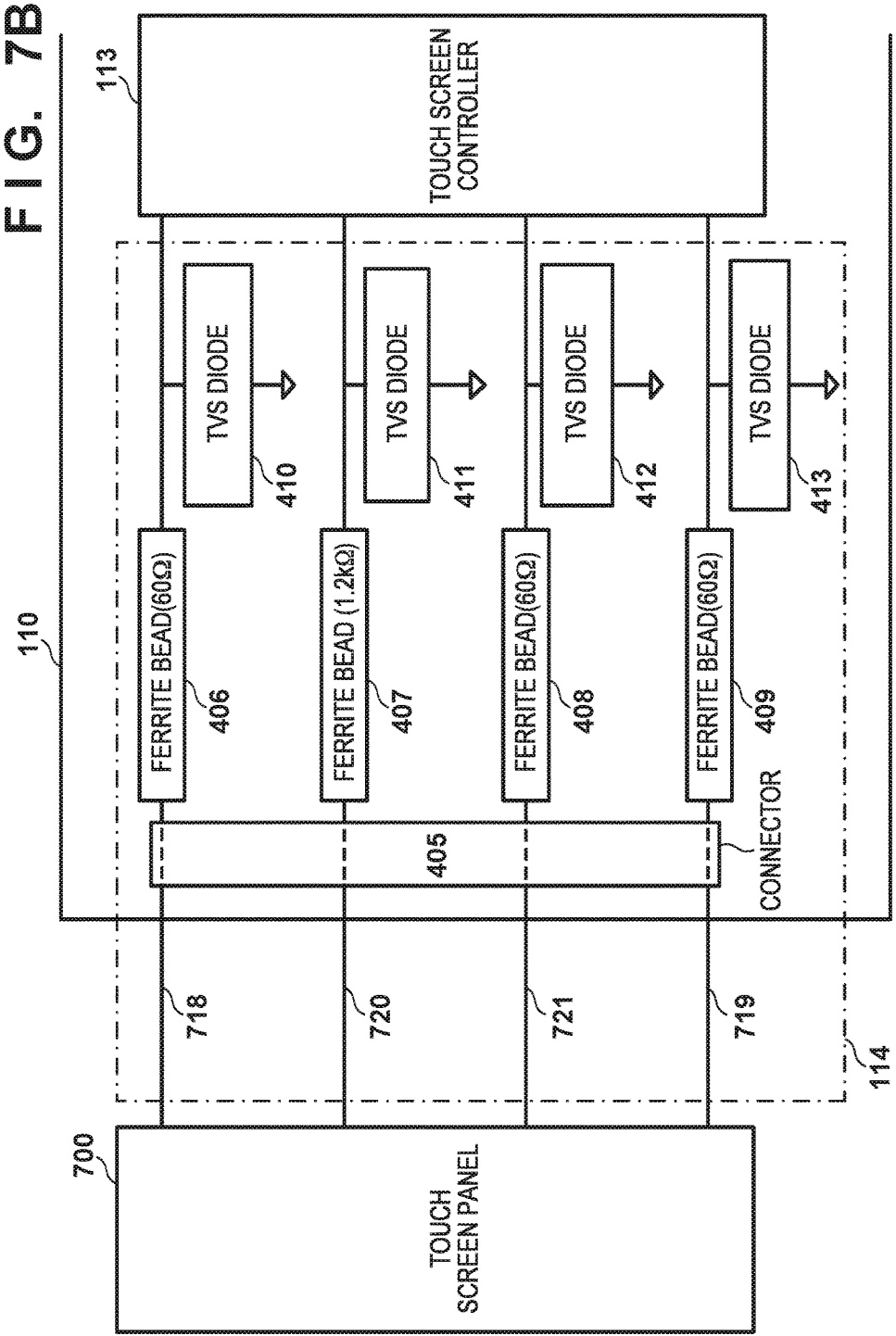

TOUCH SCREEN PANEL, INTERFACE CIRCUIT, AND INFORMATION PROCESSING APPARATUS

BACKGROUND OF THE INVENTION

Field of the Invention

The present invention relates to a touch screen panel, an interface circuit, and an information processing apparatus.

Description of the Related Art

A touch screen panel capable of directly inputting to a display unit of an electronic device is widely used. Since a user directly touches the screen of the display unit to operate the touch screen panel, conventionally, various techniques are proposed as solutions to electrostatic discharge destruction. For example, Japanese Patent Laid-Open No. 2015-133082 proposes a technique of avoiding electrostatic discharge destruction of the IC or LSI in a touch screen panel by arranging an electrode serving as a lightning conductor to surround the periphery of a transparent conductive film.

A recent touch screen panel is required to have a narrow frame from the viewpoint of size reduction and designability. That is, it is required to widen an effective area that a user can touch while reducing the outer size of the touch screen panel. However, in the technique described in Japanese Patent Laid-Open No. 2015-133082, since the electrode serving as a lightning conductor needs to be arranged on the periphery of the touch screen panel, the outer size of the touch screen panel increases as compared to a case in which the electrode serving as a lightning conductor is not arranged. If the electrode serving as a lightning conductor is arranged without increasing the outer size, the effective area of the touch screen panel becomes small.

SUMMARY OF THE INVENTION

An aspect of the present invention is to eliminate the above-mentioned problem with conventional technology.

A feature of the present invention is to provide a technique for implementing both a touch screen panel with a narrow frame and a measure against electrostatic discharge destruction.

According to a first aspect of the present invention, there is provided a touch screen panel comprising: a first electrode substrate with a rectangular first transparent conductive film formed on a surface; a second electrode substrate with a rectangular second transparent conductive film formed on a surface; a first electrode and a second electrode formed on two opposite sides of the first transparent conductive film of the first electrode substrate; a third electrode and a fourth electrode formed on two opposite sides of the second transparent conductive film of the second electrode substrate, which are different from the two opposite sides of the first transparent conductive film; an interface circuit configured to receive electrical signals from the first electrode and the second electrode, and the third electrode and the fourth electrode and process the signals; and connecting portions, respectively provided on the same side of the first electrode substrate and the second electrode substrate, configured to connect the first electrode and the second electrode, and the third electrode and the fourth electrode to the interface circuit, wherein the interface circuit includes a member configured to make an impedance of a wiring path formed on the side where the connecting portion is provided and connected to one of the first electrode, the second electrode, the third electrode, and the fourth electrode higher than an impedance of wiring paths connected to remaining electrode.

According to a second aspect of the present invention, there is provided an interface circuit configured to receive an electrical signal output from a touch screen panel and output the electrical signal, the touch screen panel including: a first electrode substrate with a rectangular first transparent conductive film formed on a surface; a second electrode substrate with a rectangular second transparent conductive film formed on a surface; a first electrode and a second electrode formed on two opposite sides of the first transparent conductive film of the first electrode substrate; a third electrode and a fourth electrode formed on two opposite sides of the second transparent conductive film of the second electrode substrate, which are different from the two opposite sides of the first transparent conductive film; and connecting portions, each provided on the same side of the first electrode substrate and the second electrode substrate, configured to output wires from the first electrode and the second electrode, and the third electrode and the fourth electrode to an outside, the interface circuit comprising a member configured to make an impedance of a wiring path formed on the side where the connecting portion is provided and connected to one of the first electrode, the second electrode, the third electrode, and the fourth electrode higher than an impedance of wiring paths connected to remaining electrode.

According to a third aspect of the present invention, there is provided an information processing apparatus comprising: a display unit; a control unit; and a touch screen panel, wherein the touch screen panel including: a first electrode substrate with a rectangular first transparent conductive film formed on a surface; a second electrode substrate with a rectangular second transparent conductive film formed on a surface; a first electrode and a second electrode formed on two opposite sides of the first transparent conductive film of the first electrode substrate; a third electrode and a fourth electrode formed on two opposite sides of the second transparent conductive film of the second electrode substrate, which are different from the two opposite sides of the first transparent conductive film; an interface circuit configured to receive electrical signals from the first electrode and the second electrode, and the third electrode and the fourth electrode and process the signals; and connecting portions, respectively provided on the same side of the first electrode substrate and the second electrode substrate, configured to connect the first electrode and the second electrode, and the third electrode and the fourth electrode to the interface circuit, wherein the interface circuit includes a member configured to make an impedance of a wiring path formed on the side where the connecting portion is provided and connected to one of the first electrode, the second electrode, the third electrode, and the fourth electrode higher than an impedance of wiring paths connected to remaining electrode.

According to a fourth aspect of the present invention, there is provided an information processing apparatus comprising: a display unit; a control unit; a touch screen panel; and an interface circuit that receives an electrical signal output from the touch screen panel and outputs the electrical signal, wherein the touch screen panel including: a first electrode substrate with a rectangular first transparent conductive film formed on a surface; a second electrode substrate with a rectangular second transparent conductive film formed on a surface; a first electrode and a second electrode formed on two opposite sides of the first transparent conductive film of the first electrode substrate; a third electrode and a fourth electrode formed on two opposite sides of the second transparent conductive film of the second electrode substrate, which are different from the two opposite sides of the first transparent conductive film; and connecting portions, each provided on the same side of the first electrode substrate and the second electrode substrate, configured to output wires from the first electrode and the second electrode, and the third electrode and the fourth electrode to an outside, wherein the interface circuit comprising: a member configured to make an impedance of a wiring path formed on the side where the connecting portion is provided and connected to one of the first electrode, the second electrode, the third electrode, and the fourth electrode higher than an impedance of wiring paths connected to remaining electrode.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 depicts a view for explaining the detailed arrangement of a touch screen I/F according to the first embodiment;

FIG. 7B depicts a view for explaining the circuit arrangement of an operation unit control substrate according to the second embodiment.

DESCRIPTION OF THE EMBODIMENTS

Embodiments of the present invention will be described hereinafter in detail, with reference to the accompanying drawings. It is to be understood that the following embodiments are not intended to limit the claims of the present invention, and that not all of the combinations of the aspects that are described according to the following embodiments are necessarily required with respect to the means to solve the problems according to the present invention.

First Embodiment

Figure 1:
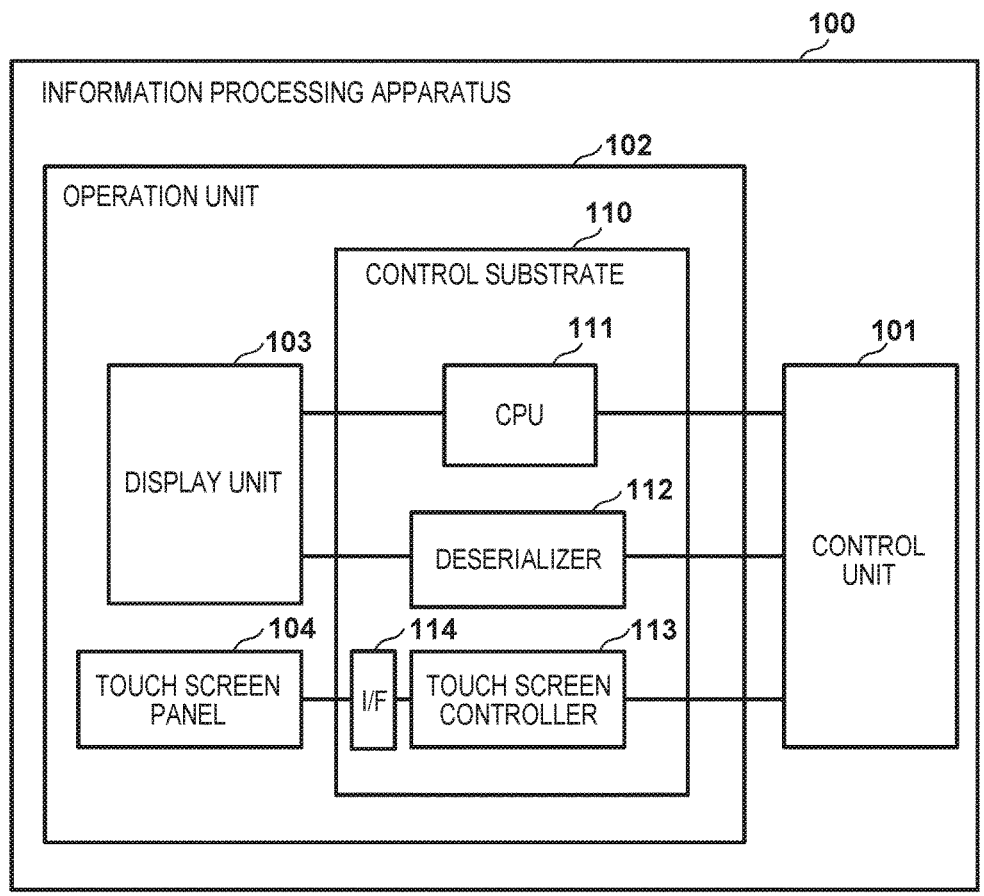
FIG. 1 is a block diagram for describing the arrangement of an information processing apparatus according to a first embodiment of the present invention.

FIG. 1 is a block diagram for describing the arrangement of an information processing apparatus 100 according to the first embodiment of the present invention.

The information processing apparatus 100 includes a control unit 101 and an operation unit 102, and can input/output information via the operation unit 102. The control unit 101 includes a main CPU and a DRAM (neither are shown), and performs communication with a CPU 111 of the operation unit, creation of drawing data to be displayed on a display unit 103, and recognition of coordinate data from a touch screen controller 113.

The operation unit 102 includes a control substrate 110, the display unit 103, and a touch screen panel 104. The control substrate 110 includes the CPU 111, a deserializer 112, and the touch screen controller 113. The CPU 111 controls lighting of the backlight of the display unit 103, and controls various devices (not shown in FIG. 1) on the control substrate 110. The deserializer 112 converts drawing data serially transferred from the control unit 101 into parallel data and transfers the data to the display unit 103. Note that depending on the arrangement of the display unit 103, drawing data serially transferred from the control unit 101 can be received and displayed. In this case, the deserializer 112 is unnecessary. When a user touches the touch screen panel 104, the touch screen controller 113 converts analog coordinate data sent from the touch screen panel 104 into digital data and transfers it to the control unit 101. In the first embodiment, the display unit 103 is a display unit including a backlight and a liquid crystal display. The display unit 103 is arranged under the touch screen panel 104 (to be described later), thereby allowing the user to intuitively touch the touch screen panel 104 and input information or various instructions while visually recognizing display on the display unit 103. The touch screen panel 104 is a resistive type touch screen panel. Details will be described later. A touch screen I/F 114 is an interface circuit between the touch screen panel 104 and the touch screen controller 113, and includes wires, connectors, and circuit elements. Details will be described later.

Figure 2:
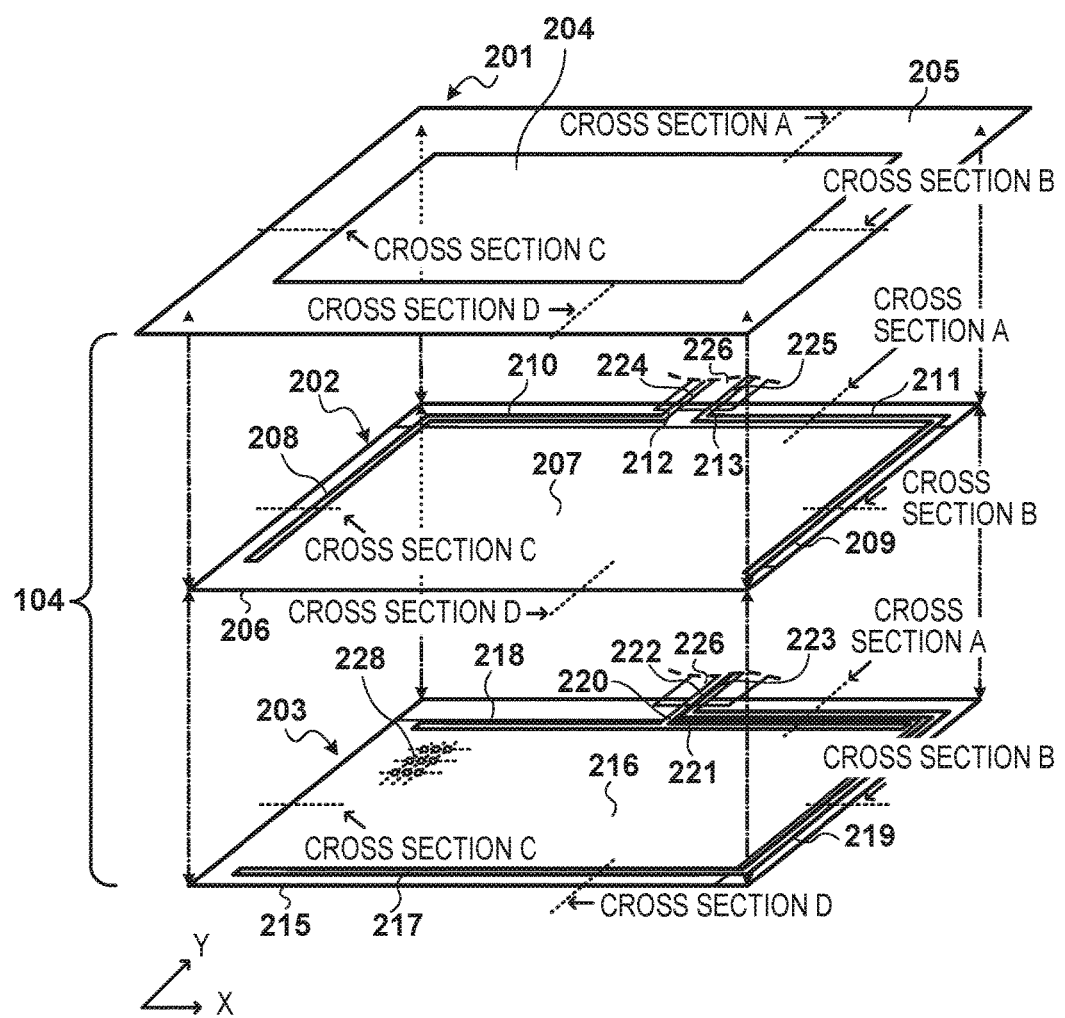
FIG. 2 depicts an exploded perspective view for explaining the hardware arrangement of a touch screen panel according to the first embodiment.

FIG. 2 depicts an exploded perspective view for explaining the hardware arrangement of the touch screen panel 104 according to the first embodiment.

The touch screen panel 104 includes a decorative film 201, an upper electrode substrate 202, and a lower electrode substrate 203. The touch screen panel 104 is arranged on the display screen of the display unit 103. When a user touches the decorative film 201 with a finger or a pen in accordance with an instruction displayed on the display screen seen through from the upper surface of the decorative film 201, the touched position is detected. When the user touches, transparent conductive films of the upper electrode substrate 202 and the lower electrode substrate 203 come into contact with each other. The touch screen controller 113 converts analog coordinate data represented by the contact position into digital data and transfers it to the control unit 101. The control unit 101 can thus obtain the x- and y-axis coordinates of the position touched by the user.

The decorative film 201 is, for example, a PET (Polyethylene terephthalate) film. The decorative film 201 includes a transparent area 204 used to view the display screen of the display unit 103 arranged under the lower electrode substrate 203, and a frame 205 having a predetermined width and provided around the transparent area 204. The frame 205 is, for example, a portion printed in a predetermined color or pattern for decoration. The decorative film 201 is arranged on the upper electrode substrate 202 and bonded to the upper electrode substrate 202 by, for example, an adhesive.

The upper electrode substrate 202 includes a flexible upper transparent insulation substrate 206. The upper transparent insulation substrate 206 is formed by a rectangular transparent substrate made of a transparent film or glass. An upper transparent conductive film 207 of ITO (tin-doped indium oxide) or the like is formed on a part of the lower surface of the upper transparent insulation substrate 206. A pair of an x-axis left electrode portion 208 and an x-axis right electrode portion 209 are formed on two sides of the upper transparent conductive film 207 parallel to the y-axis direction. In addition, one side different from the electrode portions 208 and 209 is provided with connecting portions 212 and 213 that connect the electrode portions 208 and 209 to upper wires 224 and 225 of a flexible substrate 226 extracted to the outside. Here, the connecting portion 212 is connected to the x-axis left electrode portion 208 by a metal wire 210, and the connecting portion 213 is connected to the x-axis right electrode portion 209 by a metal wire 211. Here, the electrode portions 208 and 209, the metal wires 210 and 211, and the connecting portions 212 and 213 are formed by screen printing using silver paste.

Here, when forming the upper transparent conductive film 207 on a part of the lower surface of the upper transparent insulation substrate 206, the upper transparent conductive film 207 is pattern-etched only on the necessary portion. The electrode portions 208 and 209 are formed on the upper transparent conductive film 207 and connected to the upper transparent conductive film 207. The upper transparent conductive film 207 is not formed at the portions of the metal wires 210 and 211 and the connecting portions 212 and 213, and they are prevented from contacting the upper transparent conductive film 207.

Note that the upper transparent conductive film 207 may be formed on the lower surface of the upper transparent insulation substrate 206 without performing pattern etching of the upper transparent conductive film 207 at the portions of the metal wires 210 and 211 and the connecting portions 212 and 213. In this case, a resist (not shown) for insulation may be formed between the upper transparent conductive film 207 and the metal wires 210 and 211 and the connecting portions 212 and 213 to prevent them from contacting the upper transparent conductive film 207.

The lower electrode substrate 203 includes a lower transparent insulation substrate 215. The lower transparent insulation substrate 215 is formed by a rectangular transparent substrate made of a transparent film or glass. A lower transparent conductive film 216 of ITO (tin-doped indium oxide) or the like is formed on a part of the upper surface of the lower transparent insulation substrate 215. A pair of a y-axis lower electrode portion 217 and a y-axis upper electrode portion 218 are formed on two parallel sides of the lower transparent conductive film 216 in the x-axis direction. In addition, of the two sides on which the electrode portions 217 and 218 are provided, the side corresponding to the side of the upper electrode substrate 202 to which the flexible substrate 226 is connected is provided with connecting portions 220 and 221 that connect the electrode portions 217 and 218 to lower wires 222 and 223 of the flexible substrate 226. Here, the y-axis upper electrode portion 218 and the connecting portion 220 are directly connected, and the y-axis lower electrode portion 217 and the connecting portion 221 are connected by a metal wire 219. Here, the electrode portions 217 and 218, the metal wire 219, and the connecting portions 220 and 221 are formed by screen printing using silver paste.

Here, when forming the lower transparent conductive film 216 on a part of the upper surface of the lower transparent insulation substrate 215, the lower transparent conductive film 216 is pattern-etched only on the necessary portion. The electrode portions 217 and 218 are formed on the lower transparent conductive film 216 and connected to the lower transparent conductive film 216. The lower transparent conductive film 216 is not formed at portions of the metal wire 219 and the connecting portions 220 and 221, and they are prevented from contacting the lower transparent conductive film 216. Alternatively, the lower transparent conductive film 216 may be formed on the entire upper surface of the lower transparent insulation substrate 215 without performing pattern etching of the lower transparent conductive film 216. In this case, a resist (not shown) for insulation may be formed between the lower transparent conductive film 216 and the metal wire 219 and the connecting portions 220 and 221 to prevent them from contacting the lower transparent conductive film 216.

Here, to ensure the gap between the upper transparent conductive film 207 and the lower transparent conductive film 216, dot spacers 228, each having insulating properties and a minute size, are formed at a predetermined interval on the surface of one of the upper transparent conductive film 207 and the lower transparent conductive film 216 facing the counterpart. Then, the upper electrode substrate 202 and the lower electrode substrate 203 are bonded by an adhesive or the like. At this time, the x-axis electrode portions 208 and 209 and the y-axis electrode portions 217 and 218 are caused to face in a square arrangement, and the edge portion including the electrode portions is insulated by a resist to be described later. Alternatively, the x-axis electrode portions 208 and 209 on the upper side and the y-axis electrode portions 217 and 218 on the lower side are caused to face with insulating spacers intervening between them without using a resist, and the electrode portions and the spacers may be bonded by an adhesive or the like. In addition, the upper wires 224 and 225 of the flexible substrate 226 are electrically connected to the connecting portions 212 and 213, respectively, and the lower wires 222 and 223 of the flexible substrate 226 are electrically connected to the connecting portions 220 and 221, respectively.

A cross section A, a cross section B, a cross section C, and a cross section D of the touch screen panel 104 according to the first embodiment shown in FIG. 2 will be described next with reference to FIGS. 3A to 3D.

FIGS. 3A to 3D respectively depict sectional views showing the sectional shapes of the cross section A, the cross section B, the cross section C, and the cross section D in FIG. 2. Note that the same reference numerals as in FIG. 2 denote the same parts in FIGS. 3A to 3D.

Figure 3A:
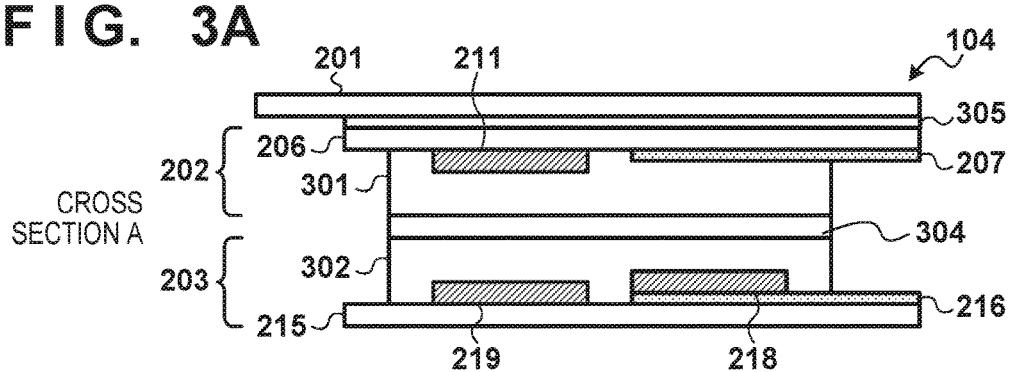
FIGS. 3A to 3D respectively depict sectional views showing the sectional shapes of a cross section A, a cross section B, a cross section C, and a cross section D in FIG. 2.

FIG. 3A depicts a sectional view of the cross section A of the touch screen panel 104 explained with reference to FIG. 2.

The decorative film 201 and the upper electrode substrate 202 are bonded by an adhesive 305. In the upper electrode substrate 202, the upper transparent conductive film 207 is formed on a part of the upper transparent insulation substrate 206, and the metal wire 211 that connects the connecting portion 213 and the x-axis right electrode portion 209 is formed on a portion where the upper transparent conductive film 207 is not formed.

Additionally, in the lower electrode substrate 203, the lower transparent conductive film 216 is formed on a part of the lower transparent insulation substrate 215, and the metal wire 219 that connects the y-axis lower electrode portion 217 and the connecting portion 221 is formed on a portion where the lower transparent conductive film 216 is not formed. In addition, the y-axis upper electrode portion 218 is connected to the lower transparent conductive film 216. Resists 301 and 302 for insulation are formed on the metal wire 211 of the upper electrode substrate 202 and on the metal wire 219 and the y-axis upper electrode portion 218 of the lower electrode substrate 203, respectively. The resists 301 and 302 are bonded by an adhesive 304.

Figure 3B:
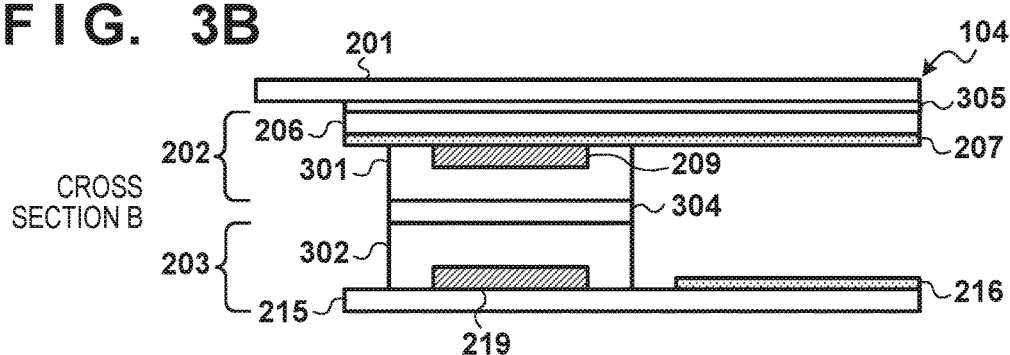

FIG. 3B depicts a sectional view of the cross section B of the touch screen panel 104 explained with reference to FIG. 2.

The decorative film 201 and the upper electrode substrate 202 are bonded by the adhesive 305. In the upper electrode substrate 202, the upper transparent conductive film 207 is formed on the upper transparent insulation substrate 206, and the x-axis right electrode portion 209 is connected to the upper transparent conductive film 207.

On the other hand, in the lower electrode substrate 203, the lower transparent conductive film 216 is formed on a part of the lower transparent insulation substrate 215, and the metal wire 219 that connects the y-axis lower electrode portion 217 and the connecting portion 221 is formed on a portion where the lower transparent conductive film 216 is not formed. The resists 301 and 302 for insulation are formed on the x-axis right electrode portion 209 of the upper electrode substrate 202 and on the metal wire 219 of the lower electrode substrate 203, respectively. The resists 301 and 302 are bonded by the adhesive 304.

Figure 3C:
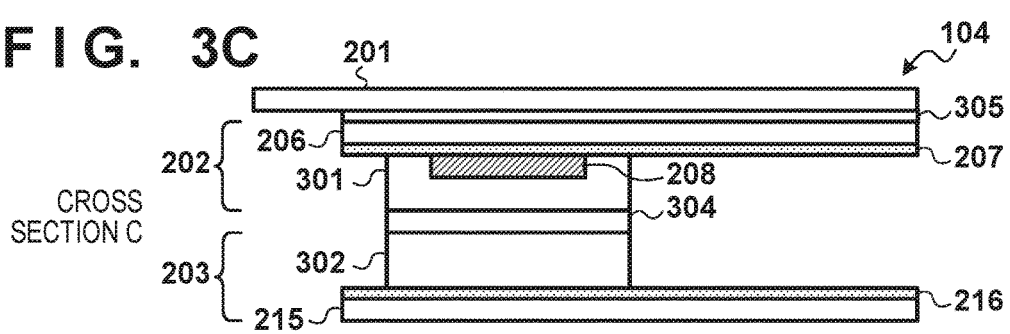

FIG. 3C depicts a sectional view of the cross section C of the touch screen panel 104 explained with reference to FIG. 2.

The decorative film 201 and the upper electrode substrate 202 are bonded by the adhesive 305. In the upper electrode substrate 202, the upper transparent conductive film 207 is formed on the upper transparent insulation substrate 206, and the x-axis left electrode portion 208 is connected to the upper transparent conductive film 207.

Additionally, in the lower electrode substrate 203, the lower transparent conductive film 216 is formed on the lower transparent insulation substrate 215. The resists 301 and 302 for insulation are formed on the x-axis left electrode portion 208 of the upper electrode substrate 202 and on lower transparent conductive film 216 of the lower electrode substrate 203, respectively. The resists 301 and 302 are bonded by the adhesive 304.

Figure 3D:
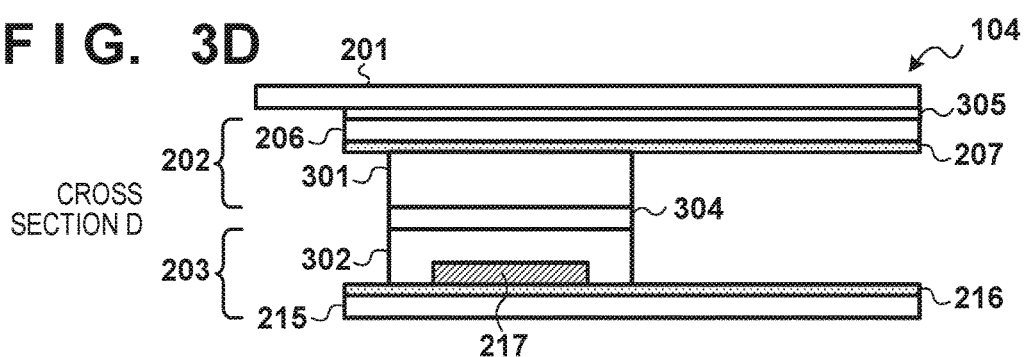

FIG. 3D depicts a sectional view of the cross section D of the touch screen panel 104 explained with reference to FIG. 2.

The decorative film 201 and the upper electrode substrate 202 are bonded by the adhesive 305. In the upper electrode substrate 202, the upper transparent conductive film 207 is formed on a part of the upper transparent insulation substrate 206.

Additionally, in the lower electrode substrate 203, the lower transparent conductive film 216 is formed on the lower transparent insulation substrate 215, and the y-axis lower electrode portion 217 is connected to the lower transparent conductive film 216. The resists (insulating materials) 301 and 302 for insulation are formed on the upper transparent conductive film 207 of the upper electrode substrate 202 and on the y-axis lower electrode portion 217 of the lower electrode substrate 203, respectively. The resists 301 and 302 are bonded by the adhesive 304.

FIG. 4 depicts a view for explaining the detailed arrangement of the touch screen I/F 114 according to the first embodiment.

The lower wires 222 and 223 and the upper wires 224 and 225 represent the wires of signal lines formed on the flexible substrate 226 described with reference to FIG. 2. The signal lines are connected to the control substrate 110 via a connector 405.

Ferrite beads 406 to 409 are connected in series with the plurality of wires 222 through 225, respectively, to remove the noise component mixed in the signals. FIG. 4 shows an example of the impedances of the ferrite beads 406 to 409 according to the first embodiment. The ferrite beads 406, 408, and 409 have an impedance of 60 Ω, and the ferrite bead 407 has an impedance of 1.2 kΩ. In the first embodiment, the impedance of the ferrite bead 407 is made higher than that of the remaining ferrite beads, thereby preventing electrostatic discharge destruction of the transparent conductive film. This will be described later in detail. TVS (Transient Voltage Suppressor) diodes 410 to 413 are mounted to protect the touch screen controller 113 from electrostatic discharge destruction. Part of static electricity flowing to the control substrate 110 via the wires 222 to 225 is removed by the ferrite beads 406 to 409. In addition, the remaining part is removed to GND (ground) via the TVS diodes 410 to 413, thereby preventing destruction of the touch screen controller 113.

Note that in the first embodiment, ferrite beads are used as members used to make the wires have impedance values different from each other. However, the present invention is not limited to this, and any member capable of changing the resistance value is usable.

FIGS. 5A to 5D respectively depict sectional views for explaining discharge paths in a case in which electrostatic discharge occurs near the frame of the touch screen panel 104 according to the first embodiment. Note that the same reference numerals as in FIGS. 3A to 3D described above denote the same parts in FIGS. 5A to 5D, and a description thereof will be omitted.

Figure 5A:
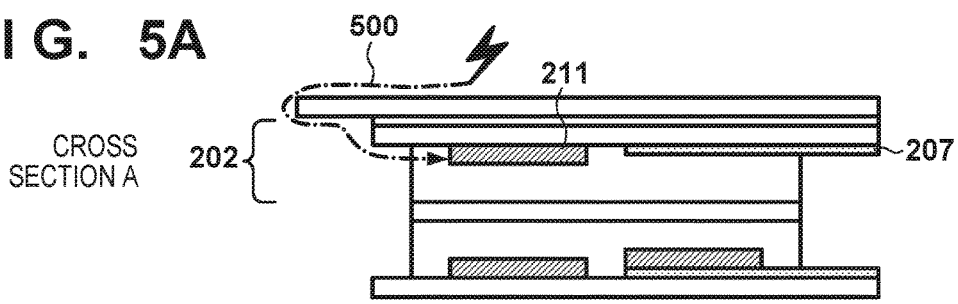
FIGS. 5A to 5D respectively depict sectional views for explaining discharge paths in a case in which electrostatic discharge occurs near the frame of the touch screen panel according to the first embodiment.

FIG. 5A depicts a view for describing a discharge path in a case in which electrostatic discharge occurs in the frame near the y-axis upper electrode portion 218. The discharged static electricity charges, via a path 500, the metal wire 211 that connects the connecting portion 213 and the x-axis right electrode portion 209. Since the upper transparent conductive film 207 and the metal wire 211 are separated by etching, as described above, the upper transparent conductive film 207 is not affected by the static electricity. The static electricity that charges the metal wire 211 flows into the operation unit control substrate 110 via the connecting portion 213 and the wire 225 and is removed to GND via the TVS diode 413 on the control substrate 110.

Figure 5B:
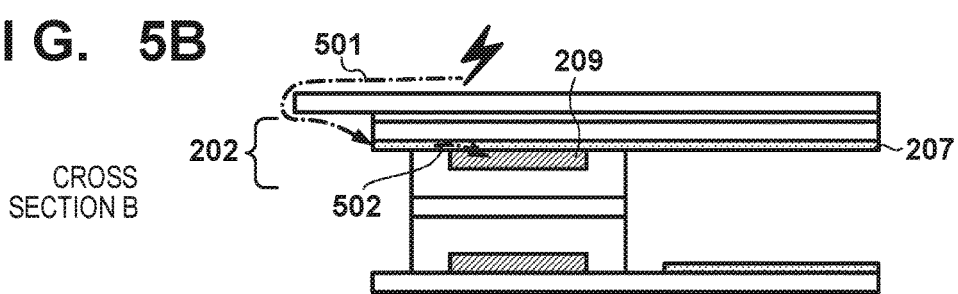

FIG. 5B depicts a view for describing a discharge path in a case in which electrostatic discharge occurs in the frame near the x-axis right electrode portion 209.

The discharged static electricity charges the upper transparent conductive film 207 via a path 501 and then flows into the x-axis right electrode portion 209 of lower impedance, as indicted by a path 502. In this case, a part of the upper transparent conductive film 207 may be damaged by the static electricity. However, this part is located in a region outside the x-axis right electrode portion 209, that is, outside the effective area of the touch screen panel. Hence, no problem arises. The static electricity that flows into the x-axis right electrode portion 209 flows into the control substrate 110 via the metal wire 211, the connecting portion 213, and the wire 225 and is removed to GND via the TVS diode 413 on the control substrate 110.

Figure 5C:
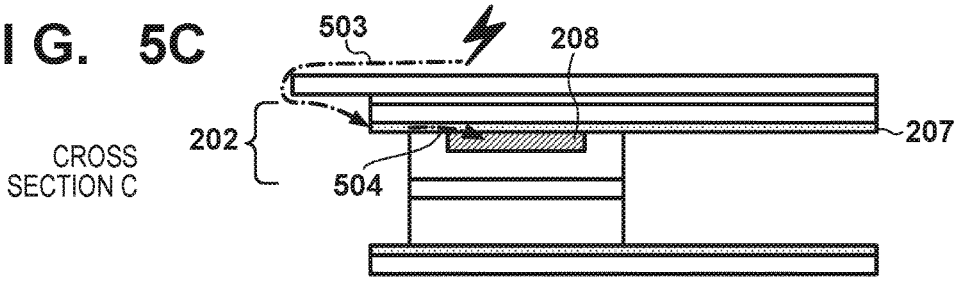

FIG. 5C depicts a view for describing a discharge path in a case in which electrostatic discharge occurs in the frame near the x-axis left electrode portion 208. The discharged static electricity charges the upper transparent conductive film 207 via a path 503 and then flows into the x-axis left electrode portion 208 of lower impedance, as indicted by a path 504. In this case, a part of the upper transparent conductive film 207 may be damaged by the static electricity. However, this part is located in a region outside the x-axis left electrode portion 208, that is, outside the effective area of the touch screen panel. Hence, no problem arises. The static electricity that flows into the x-axis left electrode portion 208 flows into the control substrate 110 via the metal wire 210, the connecting portion 212, and the wire 224 and is removed to GND via the TVS diode 410 on the control substrate 110.

Figure 5D:
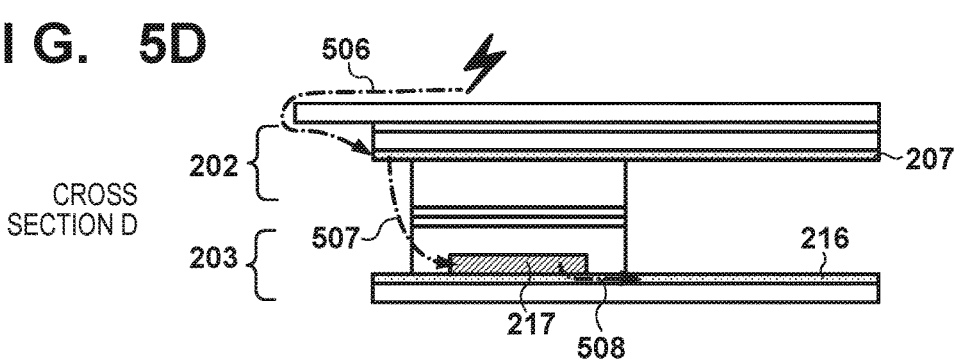

FIG. 5D depicts a view for describing a discharge path in a case in which electrostatic discharge occurs in the frame near the y-axis lower electrode portion 217. The discharged static electricity charges the upper transparent conductive film 207 via a path 506, and is secondarily discharged to the y-axis lower electrode portion 217 of lower impedance, as indicated by a path 507. In this case, a part of the upper transparent conductive film 207 may be damaged by the static electricity. However, this part is located in a region outside the electrode portion 217, that is, outside the effective area of the touch screen panel. Hence, no problem arises. Most of the static electricity that charges the y-axis lower electrode portion 217 flows into the control substrate 110 via the y-axis lower electrode portion 217, the metal wire 219, and the wire and 223. The static electricity that flows into the control substrate 110 is removed to GND via the TVS diode 412 on the control substrate 110.

It should be noted here that an increase in the impedance caused by the long path of the y-axis lower electrode portion 217 and the metal wire 219 poses a problem, and a part of the static electricity that charges the y-axis lower electrode portion 217 may flow into a lower transparent conductive film 216, as indicated by a path 508. In this case, the lower transparent conductive film 216 in the effective area on the inner side of the y-axis lower electrode portion 217 may be problematically damaged.

That is, assume that, as shown in FIG. 2, the y-axis upper electrode portion 218 is formed on the side provided with the flexible substrate 226 connected to the outside, the y-axis lower electrode portion 217 is formed on the opposite side, and electrostatic discharge occurs in the frame near the y-axis lower electrode portion 217. At this time, the electrostatic discharge charges the closest upper transparent conductive film 207. Since the impedance of the y-axis lower electrode portion 217 is higher than that of the y-axis upper electrode portion 218 by an amount corresponding to that of the metal wire 219, the static electricity that charges the upper transparent conductive film 207 is discharged to the side of the y-axis upper electrode portion 218 via the lower transparent conductive film 216. This may damage the effective area of the lower transparent conductive film 216. To prevent this, the impedance of the path from the y-axis upper electrode portion 218 to the connecting portion 220, the wire 222, and the interface circuit is made higher than the impedance of the paths of the wires from the remaining electrode portions 217, 208, and 209. Accordingly, discharge to a lower impedance can be prevented. As the characteristic feature of this embodiment, discharge from the electrode portion to the effective area of the transparent conductive film is thus suppressed to prevent damage to the effective area of the transparent conductive film.

A discharge path in a case in which electrostatic discharge occurs in the frame near the y-axis lower electrode portion 217 will be explained here with reference to FIG. 6, together with the concept of impedance.

Figure 6:
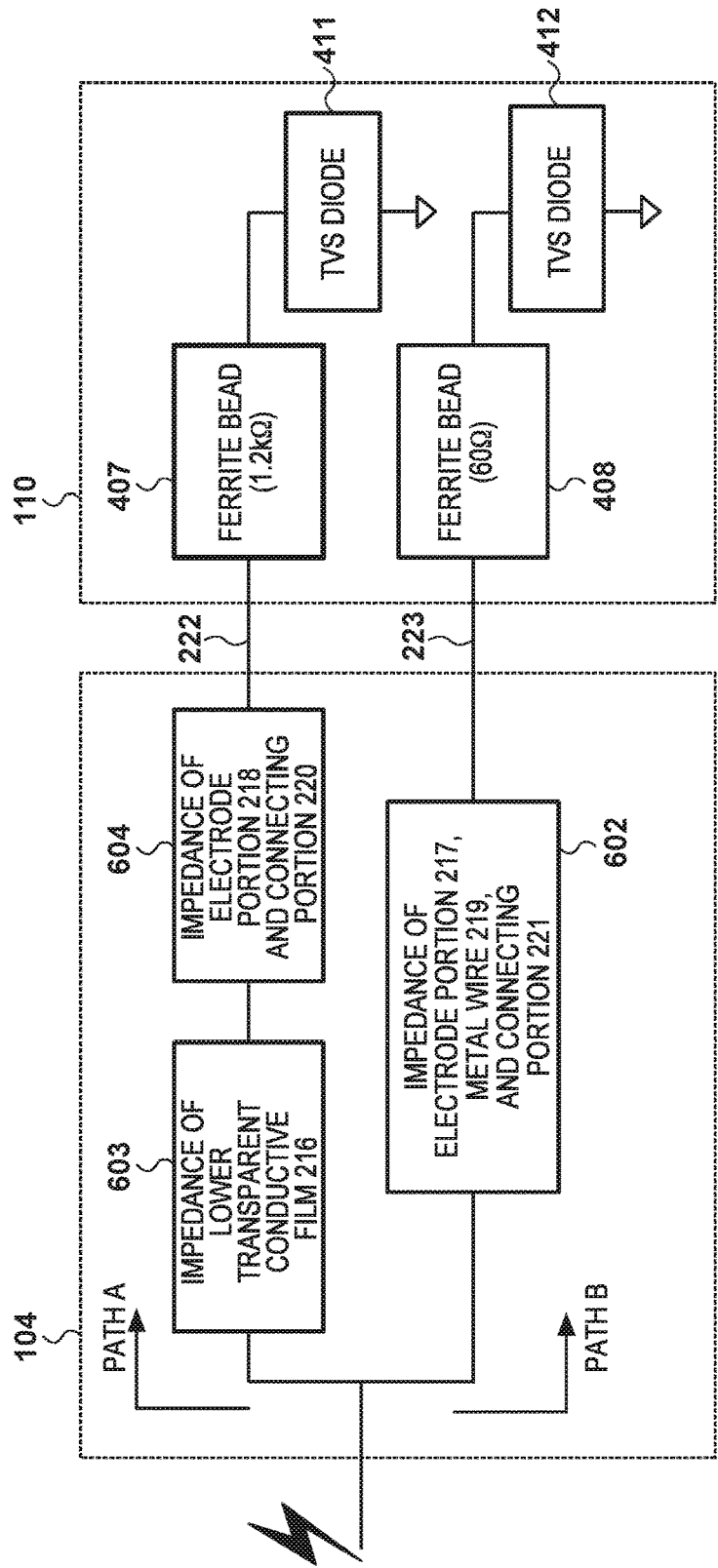
FIG. 6 depicts a conceptual view of the impedance of a discharge path in a case in which electrostatic discharge occurs in the frame near a y-axis lower electrode portion 217.

FIG. 6 depicts a view for explaining the impedances of discharge paths in the case in which electrostatic discharge occurs in the frame near the y-axis lower electrode portion 217 of the touch screen panel 104 according to the first embodiment.

As a discharge path in the case in which electrostatic discharge occurs near the frame on the side of the cross section D show in FIG. 5D, there is a path to remove static electricity to GND via the lower transparent conductive film 216, the y-axis upper electrode portion 218, the connecting portion 220, the wire 222, the ferrite bead 407, and the TVS diode 411. This path will be referred to as a path A. There also exists a path to remove static electricity to GND via the y-axis lower electrode portion 217, the metal wire 219, the connecting portion 221, the wire 223, the ferrite bead 408, and the TVS diode 412. This path will be referred to as a path B. That is, there exist two paths (to be referred to as paths A and B hereinafter).

Referring to FIG. 6, an impedance 603 represents the impedance of the lower transparent conductive film 216, and an impedance 604 represents the impedance of the y-axis upper electrode portion 218 and the connecting portion 220. An impedance 602 represents the impedance of the y-axis lower electrode portion 217, the metal wire 219, and the connecting portion 221.

The ratio of static electricity flowing to each of the paths A and B is considered to be almost proportional to the ratio of impedance of each path. The impedance of the touch screen panel 104 according to the first embodiment will be considered here. Since the impedance (for example, about 300 Ω) of the lower transparent conductive film 216 in the path A is higher as compared to the electrode portions and the metal wires, most static electricity flows to the path B. However, in a high-frequency region like electrostatic discharge, the path B probably has an impedance of non-negligible level because of its path length. For this reason, the static electricity flows to the side of the path A to some extent. The static electricity that has flowed in this way may damage the lower transparent conductive film 216.

In the first embodiment, to suppress the flow of static electricity to the side of the path A, the impedance of the ferrite bead 407 is made higher than the impedance of a ferrite bead provided for another wire on the control substrate 110. That is, the impedance of the ferrite bead 407 on the side of the path A is set to 1.2 kΩ, and the impedance of the ferrite bead 408 on the side of the path B is set to 60 Ω, thereby suppressing the amount of static electricity flowing to the side of the path A to about ½₀ of the conventional amount.

Referring back to FIG. 4, it should be noted in FIG. 4 that of the ferrite beads 406 to 409, only the impedance of the ferrite bead 407 is high.

In the first embodiment, it is important to raise the impedance of only the wire 222 connected to the electrode portion (the y-axis upper electrode portion 218 in FIG. 2) present on the side where the flexible substrate 226 configured to extract the electrical signal from each electrode portion to the outside is formed. This aims at suppressing the flow of static electricity into the path to discharge static electricity via the transparent conductive film by making the impedance of the path to discharge static electricity via the transparent conductive film higher than the impedance of other discharge paths, as described above.

Hence, in the first embodiment, the impedance of the discharge path through which static electricity may flow to damage the transparent conductive film is made higher than the impedance of other discharge paths.

As described above, according to the first embodiment, the impedance of the wiring path connected to the electrode portion that exists on the side where the flexible substrate is formed is made higher than that of the wiring paths connected to the remaining electrode portions. This can suppress damage to the transparent conductive film by static electricity.

With this arrangement, electrostatic discharge destruction of the touch screen panel can be prevented. In addition, since no special arrangement to prevent electrostatic discharge destruction is included, it is possible to implement size reduction and narrow frame of the touch screen panel.

Second Embodiment

In the above-described first embodiment, both the upper electrode substrate 202 and the lower electrode substrate 203 of the touch screen panel 104 are rectangular. Long sides are formed in the x-axis direction, and short sides are formed in the y-axis direction. The flexible substrate 226 is connected to the long side.

In the second embodiment, however, an arrangement in a case in which the flexible substrate 226 is connected to a short side of a rectangular touch screen panel having long sides in the x-axis direction and short sides in the y-axis direction, as shown in FIG. 2, will be described with reference to FIGS. 7A and 7B.

Figure 7A:
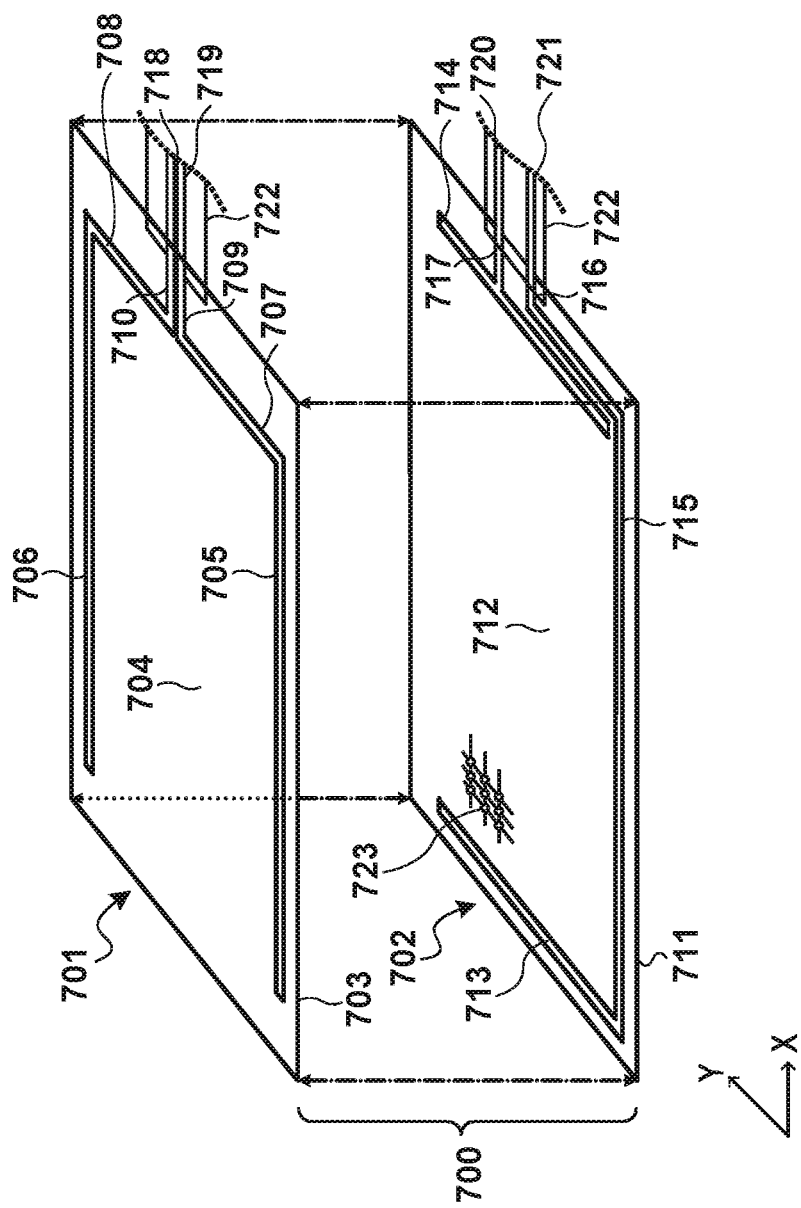
FIG. 7A depicts an exploded perspective view for explaining the arrangement of a touch screen panel according to a second embodiment.

FIG. 7A depicts an exploded perspective view for explaining the arrangement of a touch screen panel 700 according to a second embodiment.

The touch screen panel 700 shown in FIG. 7A includes an upper electrode substrate 701 and a lower electrode substrate 702. Note that a decorative film is arranged on the upper electrode substrate 701, as in FIG. 2 of the above-described first embodiment, although a description thereof will be omitted here.

The upper electrode substrate 701 includes a flexible upper transparent insulation substrate 703. The upper transparent insulation substrate 703 is formed by a rectangular transparent substrate made of a transparent film or glass. An upper transparent conductive film 704 of ITO (tin-doped indium oxide) or the like is formed on a part of the lower surface of the upper transparent insulation substrate 703. A pair of a y-axis lower electrode portion 705 and a y-axis upper electrode portion 706 are formed on two parallel sides of the upper transparent conductive film 704 in the x-axis direction. In addition, one side different from the electrode portions 705 and 706 is provided with connecting portions 709 and 710 that connect the electrode portions 705 and 706 to upper wires 718 and 719 of a flexible substrate 722 extracted to the outside. The connecting portion 709 is connected to the y-axis lower electrode portion 705 by a metal wire 707, and the connecting portion 710 is connected to the y-axis upper electrode portion 706 by a metal wire 708. The electrode portions 705 and 706, the metal wires 707 and 708, and the connecting portions 709 and 710 are formed by screen printing using silver paste.

The lower electrode substrate 702 includes a lower transparent insulation substrate 711. The lower transparent insulation substrate 711 is formed by a rectangular transparent substrate made of a transparent film or glass. A lower transparent conductive film 712 of ITO (tin-doped indium oxide) or the like is formed on a part of the upper surface of the lower transparent insulation substrate 711. A pair of an x-axis left electrode portion 713 and an x-axis right electrode portion 714 are formed on two sides of the lower transparent conductive film 712 parallel to the y-axis direction.

In addition, one side of the electrode portions 713 and 714 is provided with connecting portions 716 and 717 that connect the electrode portions 713 and 714 to lower wires 720 and 721 of the flexible substrate 722 extracted to the outside. The x-axis right electrode portion 714 and the connecting portion 717 are directly connected, and one end of the x-axis left electrode portion 713 and the connecting portion 716 are connected by a metal wire 715. The electrode portions 713 and 714, the metal wire 715, and the connecting portions 716 and 717 are formed by screen printing using silver paste. Reference numeral 723 denotes dot spacers, each having insulating properties and a minute size, like the spacers 228 in FIG. 2, which are formed to ensure the gap between the upper transparent conductive film 704 and the lower transparent conductive film 712.

Even in the touch screen panel 700 with the arrangement as shown in FIG. 7A, electrostatic discharge destruction of the lower transparent conductive film 712 can be prevented based on the same concept as in the first embodiment.

FIG. 7B depicts a view for explaining the circuit arrangement of a control substrate 110 according to the second embodiment.

It should be noted in FIG. 7B that of ferrite beads 406 to 409, only the impedance of a ferrite bead 407 is high, as in the first embodiment.

In the second embodiment, it is important to raise the impedance of only the wire 720 connected to the electrode portion (the x-axis right electrode portion 714 in FIG. 7A) present on the side where the flexible substrate 722 configured to extract each electrode portion to the outside is formed. This aims at suppressing the flow of static electricity from the x-axis left electrode portion 713 to the lower transparent conductive film 712 by making the impedance of the path passing through the wire 720 higher than the impedance of other static electricity flowing paths, as described above.

Hence, in the second embodiment as well, the impedance of the ferrite bead 407 is made higher than the impedance of the ferrite beads connected to other wires.

As described above, according to the second embodiment, the impedance of the ferrite bead connected to the electrode portion that exists on the side where the flexible substrate is formed is made higher than that of the wires connected to the remaining electrode portions. This can suppress discharge of static electricity from the electrode portion that exists on the side where the flexible substrate is formed to the transparent conductive film and damage to the transparent conductive film. This can also be applied even if the structure of the electrode portion changes, as in the touch screen panel 700.

Accordingly, electrostatic discharge destruction of the touch screen panel can be prevented. In addition, since no special arrangement to prevent electrostatic discharge destruction is included, it is possible to implement size reduction and narrow frame of the touch screen panel.

Note that in the embodiments, the impedance of the wire from the connecting portion of the lower electrode substrate is made higher than the impedance of the remaining wires. However, the present invention is not limited to this and may be applied to, for example, a wire from the connecting portion of the upper electrode substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-203035, filed Oct. 14, 2016, which is hereby incorporated by reference herein in its entirety.

What is claimed is:

1. A touch screen panel comprising:
    a first electrode substrate with a rectangular first transparent conductive film formed on a surface;
    a second electrode substrate with a rectangular second transparent conductive film formed on a surface;
    a first electrode and a second electrode formed on two opposite sides of the first transparent conductive film of the first electrode substrate;
    a third electrode and a fourth electrode formed on two opposite sides of the second transparent conductive film of the second electrode substrate, which are different from the two opposite sides of the first transparent conductive film;
    an interface circuit configured to receive electrical signals from the first electrode and the second electrode, and the third electrode and the fourth electrode and process the signals; and
    connecting portions, respectively provided on the same side of the first electrode substrate and the second electrode substrate, configured to connect the first electrode and the second electrode, and the third electrode and the fourth electrode to the interface circuit,
    wherein the interface circuit includes a member configured to make an impedance of a wiring path formed on the side where the connecting portion is provided and connected to one of the first electrode, the second electrode, the third electrode, and the fourth electrode higher than an impedance of wiring paths connected to remaining electrode.

2. The panel according to claim 1, wherein the interface circuit comprises:
    a plurality of wires connected to the first electrode, the second electrode, the third electrode, and the fourth electrode, respectively;
    ferrite beads connected in series with the plurality of wires, respectively; and
    diodes connected between ground and the plurality of wires, respectively.

3. The panel according to claim 1, wherein the member comprises a ferrite bead, and the impedance of a ferrite bead of a wire formed on the side where the connecting portion is provided and connected to one of the first electrode, the second electrode, the third electrode, and the fourth electrode is higher than the impedance of ferrite beads connected to the remaining electrode portions.

4. The panel according to claim 1, wherein the first electrode and the second electrode are formed along opposite sides of an effective area of the first transparent conductive film in a y-axis direction, and the third electrode and the fourth electrode are formed along opposite sides of an effective area of the second transparent conductive film in an x-axis direction.

5. The panel according to claim 1, wherein the first electrode and the second electrode are formed along opposite sides of an effective area of the first transparent conductive film in an x-axis direction, and the third electrode and the fourth electrode are formed along opposite sides of an effective area of the second transparent conductive film in a y-axis direction.

6. The panel according to claim 1, wherein the first electrode substrate further comprises metal wires configured to connect the connecting portions to the first electrode and the second electrode, and the second electrode substrate further comprises metal wires configured to connect the connecting portions to the third electrode and the fourth electrode.

7. The panel according to claim 1, wherein the first electrode substrate is arranged above the second electrode substrate.

8. An interface circuit configured to receive an electrical signal output from a touch screen panel and output the electrical signal,
    the touch screen panel including:
    a first electrode substrate with a rectangular first transparent conductive film formed on a surface;
    a second electrode substrate with a rectangular second transparent conductive film formed on a surface;
    a first electrode and a second electrode formed on two opposite sides of the first transparent conductive film of the first electrode substrate;
    a third electrode and a fourth electrode formed on two opposite sides of the second transparent conductive film of the second electrode substrate, which are different from the two opposite sides of the first transparent conductive film; and
    connecting portions, each provided on the same side of the first electrode substrate and the second electrode substrate, configured to output wires from the first electrode and the second electrode, and the third electrode and the fourth electrode to an outside,
    the interface circuit comprising a member configured to make an impedance of a wiring path formed on the side where the connecting portion is provided and connected to one of the first electrode, the second electrode, the third electrode, and the fourth electrode higher than an impedance of wiring paths connected to remaining electrode.

9. The circuit according to claim 8, wherein the interface circuit further comprises:
    a connector configured to receive a plurality of wires connected to the first electrode, the second electrode, the third electrode, and the fourth electrode, respectively;
    ferrite beads connected in series with the plurality of wires, respectively, via the connector; and
    diodes connected between ground and the plurality of wires, respectively, via the connector,
    wherein the impedance of a ferrite bead of a wire formed on the side where the connecting portion is provided and connected to one of the first electrode, the second electrode, the third electrode, and the fourth electrode is higher than the impedance of ferrite beads connected to the remaining electrode.

10. An information processing apparatus comprising:
    a display unit;
    a control unit; and
    a touch screen panel,
    wherein the touch screen panel including:
    a first electrode substrate with a rectangular first transparent conductive film formed on a surface;
    a second electrode substrate with a rectangular second transparent conductive film formed on a surface;
    a first electrode and a second electrode formed on two opposite sides of the first transparent conductive film of the first electrode substrate;
    a third electrode and a fourth electrode formed on two opposite sides of the second transparent conductive film of the second electrode substrate, which are different from the two opposite sides of the first transparent conductive film;

an interface circuit configured to receive electrical signals from the first electrode and the second electrode, and the third electrode and the fourth electrode and process the signals; and connecting portions, respectively provided on the same side of the first electrode substrate and the second electrode substrate, configured to connect the first electrode and the second electrode, and the third electrode and the fourth electrode to the interface circuit, wherein the interface circuit includes a member configured to make an impedance of a wiring path formed on the side where the connecting portion is provided and connected to one of the first electrode, the second electrode, the third electrode, and the fourth electrode higher than an impedance of wiring paths connected to remaining electrode.

11. An information processing apparatus comprising:

a display unit;

a control unit;

a touch screen panel; and an interface circuit that receives an electrical signal output from the touch screen panel and outputs the electrical signal, wherein the touch screen panel including:

a first electrode substrate with a rectangular first transparent conductive film formed on a surface;

a second electrode substrate with a rectangular second transparent conductive film formed on a surface;

a first electrode and a second electrode formed on two opposite sides of the first transparent conductive film of the first electrode substrate;

a third electrode and a fourth electrode formed on two opposite sides of the second transparent conductive film of the second electrode substrate, which are different from the two opposite sides of the first transparent conductive film; and connecting portions, each provided on the same side of the first electrode substrate and the second electrode substrate, configured to output wires from the first electrode and the second electrode, and the third electrode and the fourth electrode to an outside, wherein the interface circuit comprising:

a member configured to make an impedance of a wiring path formed on the side where the connecting portion is provided and connected to one of the first electrode, the second electrode, the third electrode, and the fourth electrode higher than an impedance of wiring paths connected to remaining electrode.

* * * * *